(12) United States Patent
Peng et al.

(10) Patent No.: US 8,580,627 B2
(45) Date of Patent: Nov. 12, 2013

(54) COMPOUND SEMICONDUCTOR DEVICE AND METHOD FOR FABRICATING THE SAME

(75) Inventors: Kuo-Jui Peng, Taipei (TW);
Chuan-Jane Chao, Hsinchu (TW);
Tsyr-Shyang Liou, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 338 days.

(21) Appl. No.: 12/967,289

(22) Filed: Dec. 14, 2010

(65) Prior Publication Data

US 2011/0291226 A1    Dec. 1, 2011

(30) Foreign Application Priority Data

May 25, 2010  (TW) ............................... 99116630 A

(51) Int. Cl.
*H01L 21/338* (2006.01)
*H01L 21/28* (2006.01)
*H01L 21/3205* (2006.01)

(52) U.S. Cl.
USPC ................... 438/171; 438/606; 438/E21.399

(58) Field of Classification Search
USPC .................. 257/E21.398, E21.399, E21.542;
438/171, 412, 606, 779
See application file for complete search history.

(56) References Cited

U.S. PATENT DOCUMENTS

2004/0063292 A1*  4/2004  Kurokawa et al. ............ 438/312

* cited by examiner

*Primary Examiner* — Daniel Luke
(74) *Attorney, Agent, or Firm* — Winston Hsu; Scott Margo

(57) ABSTRACT

A compound semiconductor device is provided, including a gallium arsenide (GaAs) substrate having a first protrusion portion and a second protrusion portion, wherein the first protrusion portion is formed over a first portion of the GaAs substrate and the second protrusion is formed over a second portion of the GaAs substrate. A first element is disposed over the first protrusion portion, and a second element is disposed over the second protrusion portion.

6 Claims, 9 Drawing Sheets

COMPOUND SEMICONDUCTOR DEVICE AND METHOD FOR FABRICATING THE SAME

CROSS REFERENCE TO RELATED APPLICATIONS

This Application claims priority of Taiwan Patent Application No. 99116630, filed on May 25, 2010, the entirety of which is incorporated by reference herein.

BACKGROUND OF THE INVENTION

1. Field of the Invention

The present invention relates to semiconductor fabrication, and in particular relates to compound semiconductor devices using gallium arsenide (GaAs) substrates and methods for fabricating the same, wherein elements comprising conductive materials therein can be provided with improved electrical stress performance.

2. Description of the Related Art

Gallium arsenide (GaAs) is one of the known compound semiconductor materials which has high electron mobility (typically about six times greater than that of silicon material), high saturated drifting speeds, and semi-insulating properties; therefore, being suitable for being applied in fabrication processes such as high-speed device fabrication. In addition, Gallium arsenide material also shows properties such as high output efficiency, low power consumption, low noise, etc. which are good for fabrication of high frequency communication devices capable of replacing conventional low frequency silicon communication devices to thereby satisfy needs of modern communication and network applications.

FIG. 1 shows a conventional compound semiconductor device 150 fabricated over a gallium arsenide (GaAs) substrate 100. Herein, for the purpose of simplicity, only a portion of the compound semiconductor device 150 is illustrated.

As shown in FIG. 1, similar with the conventional silicon semiconductor devices fabricated over a silicon substrate, the compound semiconductor device 150 comprises an integrated circuit made of a plurality of different elements. Elements which form the integrated circuit in the compound semiconductor device 150 comprise, for example, active elements such as transistors or diodes, and passive elements such as resistors and capacitors, and other elements such as conductive pads. These elements all comprise conductive materials therein.

For the purpose of simplicity, only two adjacent elements A and B are illustrated in FIG. 1, and these two elements A and B can be same or different elements which are selected from the elements mentioned above.

Although the GaAs substrate 100 is a semi-insulating substrate, the elements A and B of the compound semiconductor device 150, however, typically comprise device layers made of conductive materials, such as P-doped or N-doped channel layers and ohmic contact layers. Due to physical connections of these device layers with the GaAs substrate 100, conductive dopants or metal elements in the conductive materials may be diffused into the GaAs substrate 100 during fabrication or operation of the compound semiconductor device 150; thereby causing undesired inter-diffusion effects and producing undesired electrical conductivity for portions of the GaAs substrate 100 adjacent to the elements A and B.

Therefore, once large currents such as ESD currents are conducted to the element A and/or the element B, the large currents may migrate along a current path E1 (illustrated in dashed lines) extending along a top surface of the GaAs substrate 100 between the elements A and B and cause electromigration of the adjacent elements A and B. This may cause electrical breakdown of the elements A and B and also cause malfunction of the compound semiconductor device 150.

Therefore, to prevent undesired electrical breakdown of the elements, a pitch P1 must be set between the elements A and B to prevent occurrence of the undesired electromigration. The size of the pitch P1 can be determined according to fabrication processes of the elements A and B, and is typically about 20-300 microns.

Requirement of the pitch P1, however, may restrict the amount of elements that may be provided over the GaAs substrate 100, and is not advantageous for size reduction of the compound semiconductor device 150.

FIGS. 2-5 are schematic diagrams showing conventional elements which may be implemented as the elements A and B formed over the GaAs substrate 100.

In FIG. 2, a conventional transistor 10 is illustrated, comprising a channel layer 102, an ohmic contact layer 106, passivation layers 110 and 116, a gate electrode 108 and contact electrodes 114. Herein, for the purpose for simplicity, the channel layer 102 is illustrated as a single layer, but it is typically formed of a plurality of stacked sub-layers comprising P-type and/or N-type doped GaAs materials and/or undoped GaAs materials. In addition, a source region, a drain region and a channel region (all not shown) can be respectively formed in a portion in the channel layer 102. The ohmic contact layer 106 can be respectively disposed over the source region and the drain region, and the ohmic contact layer 106 may comprise stacked sub-layers made of AuGe, Ni, and Au. The gate electrode 108 is disposed over a portion of the channel region. The passivation layer 110 conformably covers portions of the GaAs substrate 110, the channel layer 102, the ohmic contact layers 106, the gate electrode 108. The contact electrodes 114 are respectively formed over portions of the passivation layer 110, the ohmic contact layer 106, and the gate electrode 108. In addition, another passivation layer 116 partially covers the passivation layer 110 and the contact electrode 114, and an opening 118 is formed in a portion thereof to expose a portion of each of the contact electrodes 108. In FIG. 3, a cross section taken along line 3-3 in FIG. 2 is illustrated, showing configurations in the source region or the drain region.

FIGS. 4 and 5 show a conventional capacitor 20 and a conventional conductive pad 30, respectively. As shown in FIGS. 4 and 5, the capacitor 20 and the conductive pad 30 are formed from the device layers similar with those formed in the transistor 10 as shown in FIGS. 2-3, and the capacitor 20 and the conductive pad 30 can be simultaneously formed during fabrication of the transistor 10. In the figures, the same references represent the same components. The contact electrode 114 formed in the capacitor 20 can function as a top electrode and the passivation layer 110 may function as a capacitance layer, and the gate electrode 108 and the ohmic contact layer 110 may function as a bottom electrode. The conductive pad 30 shown in FIG. 5 may comprise an ohmic contact layer 106, and can thus electrically contact the conductive electrode 114 of the GaAs substrate 100 through the ohmic contact layer 106.

Thus, to improve integration of elements in the compound semiconductor device 150 and reduce chip size thereof, a novel layout design of the compound semiconductor device is desired.

BRIEF SUMMARY OF THE INVENTION

Compound semiconductor devices and methods for fabricating the same are provided.

An exemplary compound semiconductor device comprises a gallium arsenide (GaAs) substrate having a first protrusion portion and a second protrusion portion, wherein the first protrusion portion is formed over a first portion of the GaAs substrate and the second protrusion is formed over a second portion of the GaAs substrate. A first element is disposed over the first protrusion portion, and a second element is disposed over the second protrusion portion.

An exemplary method for fabricating a compound semiconductor device comprises providing a gallium arsenide (GaAs) substrate. A first element and a second element are formed over a first portion and a second portion of the GaAs substrate, respectively. A first passivation layer is formed over the GaAs substrate, the first element, and the second element. The first passivation layer formed over the first element, the second element, and the GaAs substrate between the first and second elements are partially removed. An etching process is performed using the first passivation layer as an etching mask to form a trench in a portion of the GaAs substrate between the first and second elements. An electrode is formed over the first and second elements. A second passivation layer is formed to conformably cover the first passivation layer, the electrode, and the GaAs substrate exposed by the trench.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 6-8, 9a-9e and 10 are schematic diagrams showing exemplary embodiments of the invention. In these figures, the same references represent the same elements.

Figure 6:
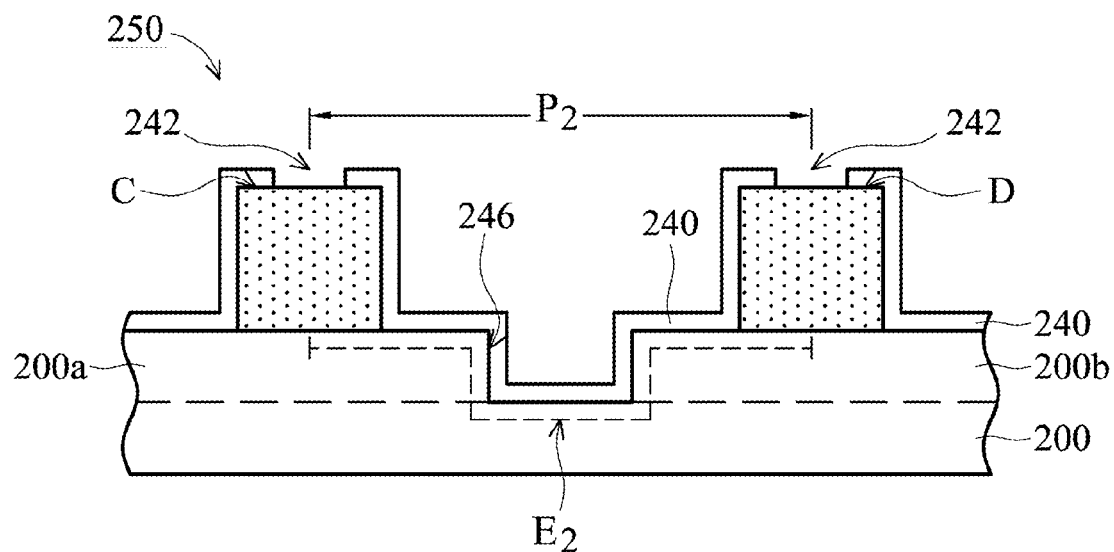
FIG. 6 is a schematic cross section of a semiconductor device according to an embodiment of the invention.

In FIG. 6, an exemplary compound semiconductor device 250 is provided. For simplicity, only a portion of the compound semiconductor device 250 is illustrated.

As shown in FIG. 6, the compound semiconductor device 250 comprises a gallium arsenide (GaAs) substrate 200 with at least one trench 246 formed therein, thereby defining two isolated protrusion portions 200a and 200b of the GaAs substrate 200. An element C is disposed over the protrusion portion 200a, and another element D is disposed over the protrusion portion 200b. A passivation layer 240 is formed over the GaAs substrate 200, conformably covering the elements C and D, and portions of the GaAs substrate exposed by the trench 246. An opening 242 is formed in a portion of the passivation layer 240 formed above the elements C and D to partially expose a portion of the elements C and D.

In one embodiment, the elements C and D can be the same or different elements comprising conductive materials and are selected from the group consisting of active elements such as transistors or diodes, passive elements such as resistors or capacitors, and other elements such as conductive pads. In another embodiment, the elements C and D may comprise the conventional transistors, capacitors and conductive pads that are shown in FIGS. 2-5.

In one embodiment, the passivation layer 240 may comprises dielectric materials such as silicon nitride for not only functioning as a dielectric layer for the capacitors but also providing water-proof and scratch-proof functions for each element in the compound semiconductor devices 250. In another embodiment, the trench 246 can be formed by a patterning process and is formed in a portion of the GaAs substrate between the elements C and D, having a depth of about 0.01-20 μm from the top surface of the GaAs substrate 200.

Figure 1:
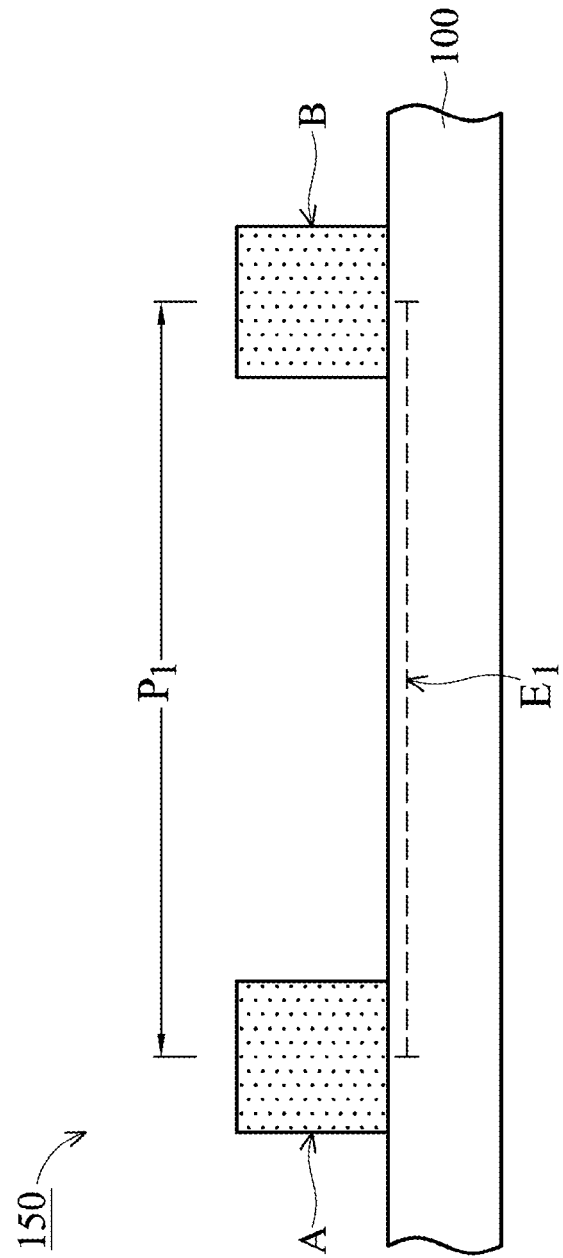
FIG. 1 is a schematic cross section of a conventional compound semiconductor device.
Figure 2:
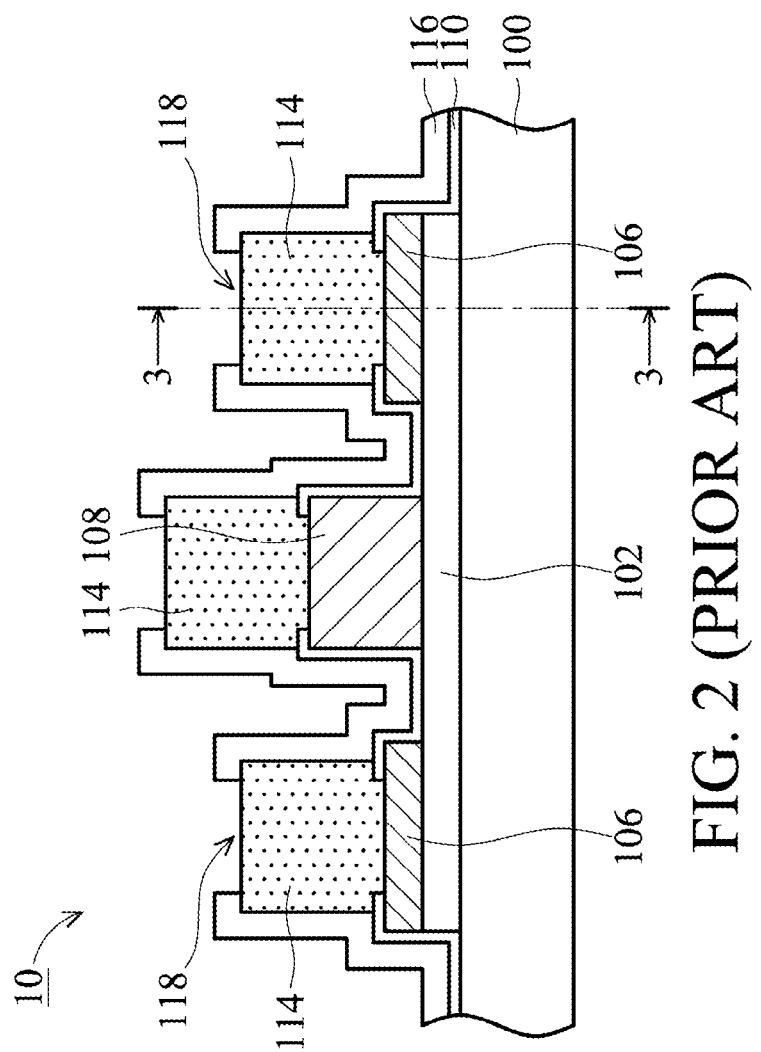
FIG. 2 is a schematic cross section of a conventional transistor.
Figure 5:
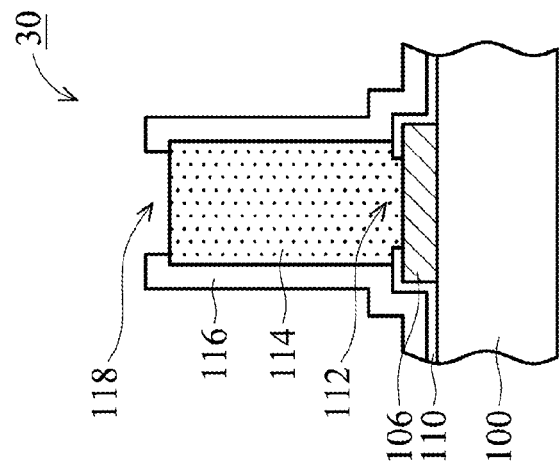
FIG. 5 is a schematic cross section of a conventional conductive pad.
Figure 4:
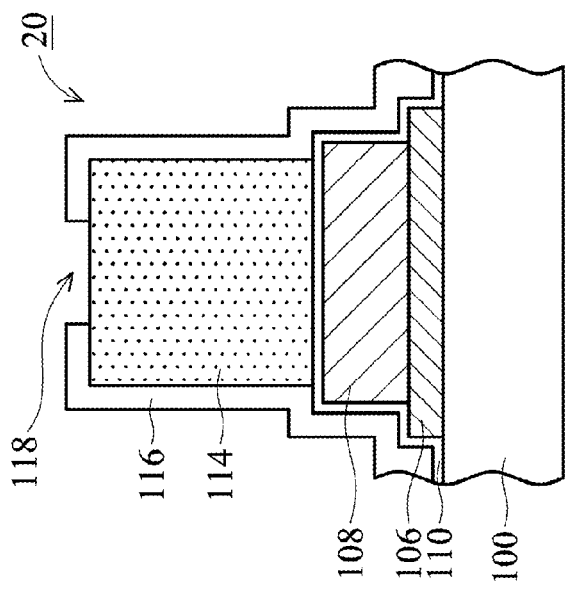
FIG. 4 is a schematic cross section of a conventional capacitor.
Figure 3:
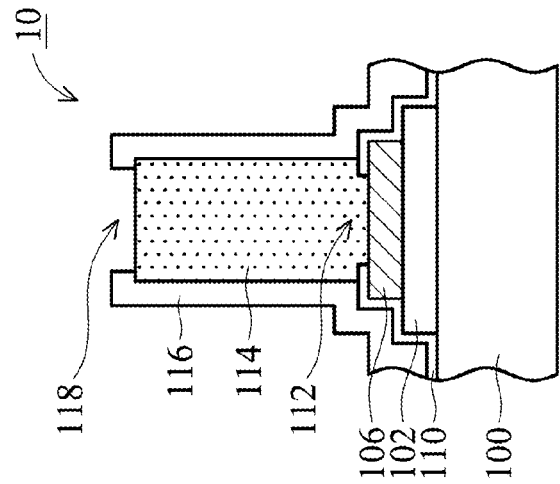
FIG. 3 shows a cross section taken along line 3-3 in FIG. 2.

As shown in FIG. 6, due to formation of the trench 246 in a portion of the GaAs substrate 200, a pitch P2 formed between the devices C and D can be reduced to, for example, about 2-30 μm, and a conductive path E2 extending along the top surface of the GaAs substrate 200 between the elements C and D can also extend along the trench 246 so as to pass through a plurality of additional vertical portions perpendicular to the top surface of the GaAs substrate 200. The conductive path E2 thus has an overall length not less than the conventional conductive path E1 shown in FIG. 1. Therefore, the compound semiconductor device 250 can be formed with no electrical breakdown occurring in the elements C and/or D while reducing the pitch P2 provided between the elements C and D. Device integration of the compound semiconductor device 250 is therefore improved and chip size of the compound semiconductor device 250 is therefore reduced.

Figure 7:
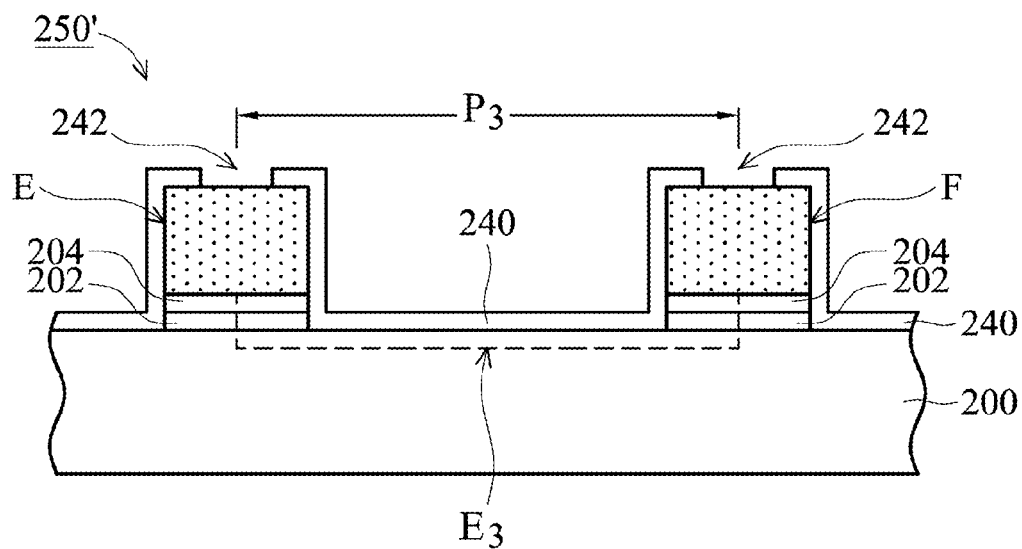
FIG. 7 is a schematic cross section of a semiconductor device according to another embodiment of the invention.

In FIG. 7, another exemplary compound semiconductor device 250' is illustrated. For simplicity, only a portion of the compound semiconductor device 250' is illustrated.

In this embodiment, the compound semiconductor device 250' comprises a planar GaAs substrate 200 having no trench formed therein, and a plurality of patterned channel layers 202 formed over various portions of the GaAs substrate 200, respectively, and a patterned capsule layer 204 optionally formed over each of the channel layers 202. The channel layer 202 can be the same as the channel layer 102 shown in FIGS. 2-3, and the capsule layer 204 can be a dielectric layer made of materials such as silicon nitride for providing functions such as wafer-proofing and scratch-proofing functions for the GaAs substrate 200. Therefore, the isolated first protrusion portion (i.e. the channel layer 202 and the capsule layer 204 at the left of FIG. 7) and the second protrusion portion (i.e. the channel layer 202 and the capsule layer 204 at the right of FIG. 7) are defined over various portions of the GaAs substrate 200 by the channel layer 202 and the capsule layer 204 formed thereover. An element E is disposed over the first protrusion portion and another element F is disposed over the second protrusion portion. A passivation layer 240 is provided over the GaAs substrate 200, the channel layers 202, the capsule layers 240 and the elements E and F, and a portion the passivation layer 240 formed over the elements E and F is formed with an opening 242 to partially expose the elements E and F.

In this embodiment, the elements E and F can be the same or different devices, and based on formations of the channel layers 202 and the capsule layers 204, the elements E and F are preferably passive elements such as resistors, capacitors, and other devices such as conductive pads, and not active elements such as transistors and diodes. The elements E and F may incorporate conventional capacitors and conductive pads shown in FIGS. 3-4.

As shown in FIG. 7, due to formations of the patterned channel layers 202 and capsule layer 204 over various portions of the GaAs substrate 200 and formations of elements E and F thereon, respectively, a pitch P3 between the elements E and F can be reduced to a distance of, for example, about 2-30 μm, and a conductive path E3 formed between the elements E and F may not only comprise a portion extending along the top surface of the GaAs substrate 200 but also may comprise other portions vertically extending into the channel layers 202 and the capsule layers 204. Thus, an overall length of conductive pitch E3 is not less than the conventional conductive path E1 shown in FIG. 1. Therefore, the compound semiconductor device 250' can be formed with no electrical breakdown occurring in the elements E and/or F while reducing the pitch P3 provided between the elements E and F. Device integration of the compound semiconductor device 250' is therefore improved and chip size of the compound semiconductor device 250' is therefore reduced.

Figure 8:
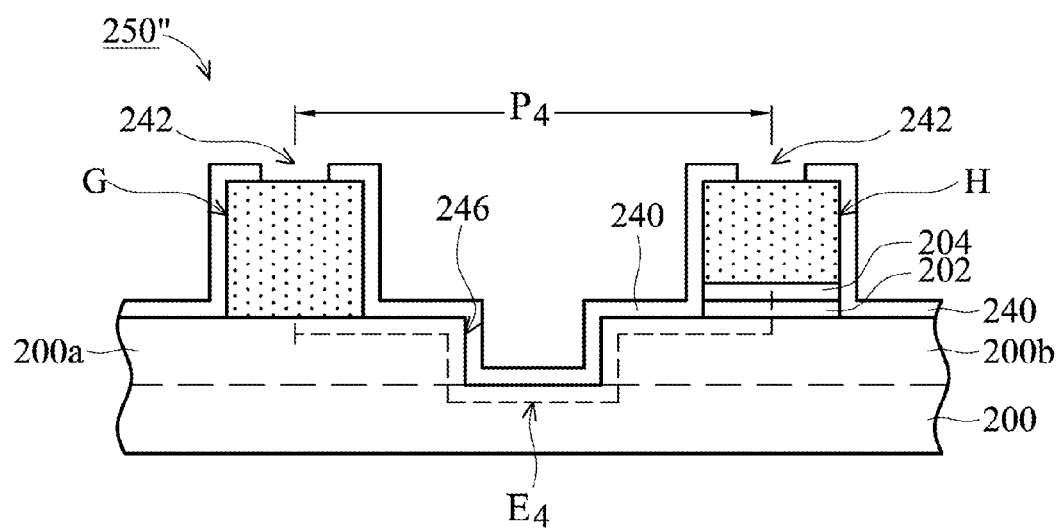
FIG. 8 is a schematic cross section of a semiconductor device according to yet another embodiment of the invention.

In FIG. 8, yet another exemplary compound semiconductor device 250" is illustrated. For simplicity, only a portion of the compound semiconductor device 250" is illustrated.

As shown in FIG. 8, the compound semiconductor device 250" comprises a gallium arsenide (GaAs) substrate 200 with at least one trench 246 formed therein, thereby defining isolated first and second protrusion portions 200a and 200b of the GaAs substrate 200. In addition, as illustrated in FIG. 7, a patterned channel layer 202 is provided over a portion of the second protrusion portion 200b and an optional capsule layer 204 is provided over the channel layer 202. An element G is disposed over the protrusion portion 200a, and another element H is disposed over the capsule layer 204 and the channel layer 202. A passivation layer 240 is formed over the GaAs substrate 200, conformably covering the elements G and H, the channel layer 202, the capsule layer 204, and portions of the GaAs substrate 200 exposed by the trench 246. An opening 242 is formed in a portion of the passivation layer 240 formed above the elements G and H to partially expose a portion of the elements G and H.

In one embodiment, the elements G and H can be the same or different elements, and based on formations of the channel layers 202 and the capsule layers 204, the element H is preferably passive elements such as resistors, capacitors, and other devices such as conductive pads, and not active elements such as transistors and diodes. The element G may comprise active elements such as transistors or diodes, passive elements such as resistors or capacitors, and other elements such as conductive pads. In another embodiment, the elements G and H may comprise the conventional transistors, capacitors and conductive pads that are shown in FIGS. 1-5.

As shown in FIG. 8, due to formation of the trench 246 in a portion of the GaAs substrate 200 and formations of the patterned channel layer 202 and the capsule layer 204 formed over the second protrusion portion 200b, a pitch P4 formed between the devices G and H can be reduced to, for example, about 2-30 μm, and a conductive path E4 extending along the top surface of the GaAs substrate 200 between the elements G and H now also extends along the trench 246 so as to pass through a plurality of additional vertical portions perpendicular to the top surface of the GaAs substrate 200. The conductive path E4 thus has an overall length not less than the conventional conductive path E1 shown in FIG. 1. Therefore, the compound semiconductor device 250" can be formed with no electrical breakdown occurring in the elements G and/or H while reducing the pitch P4 provided between the elements G and H is reduced. Device integration of the compound semiconductor device 250" is therefore improved and chip size of the compound semiconductor device 250" is therefore reduced.

FIGS. 9a-9e are schematic diagrams showing an exemplary method for fabricating a compound semiconductor device.

Figure 9A:
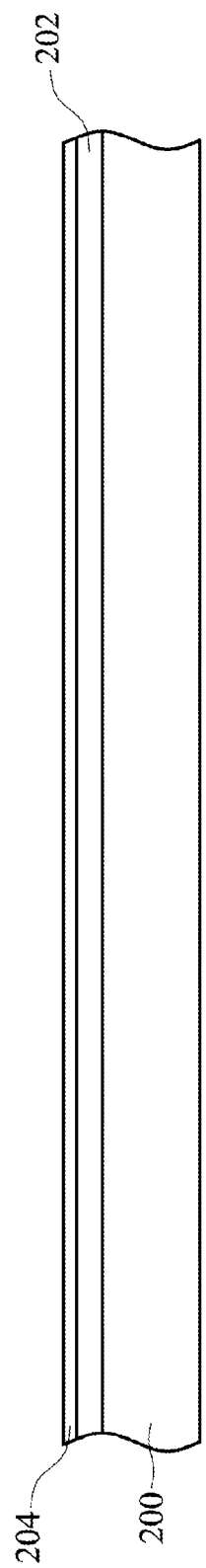
FIGS. 9a-9e are schematic cross sections showing a method for fabricating a semiconductor device according to an embodiment of the invention.

In FIG. 9a, a GaAs wafer, for example a commercially available GaAs wafer, is provided, including a GaAs substrate 200 with a channel layer 202 and a capsule layer 204 formed thereon. Herein, the channel layer 202 is illustrated as a single layer, but, however, may comprise a plurality stacked sub-layers including p-type and/or N type doped GaAs materials and/or non-doped GaAs materials. The capsule layer 204 can be formed of silicon nitride as described above, and has a thin thickness of about 100-2000 Å.

Figure 9B:
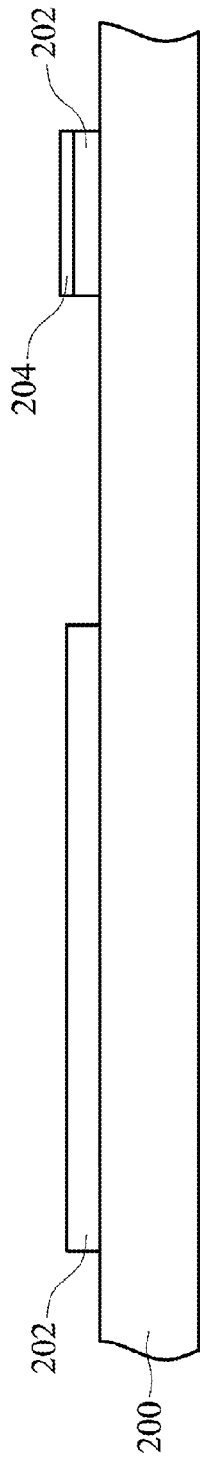

As shown in FIG. 9b, a patterning process (not shown) is performed, such as conventional photolithography and etching processes, to form a patterned channel layer 202 over a portion of the GaAs substrate 200 and a patterned channel layer 202 with a capsule layer 204 formed thereon over another portion of the GaAs substrate 200.

Figure 9C:
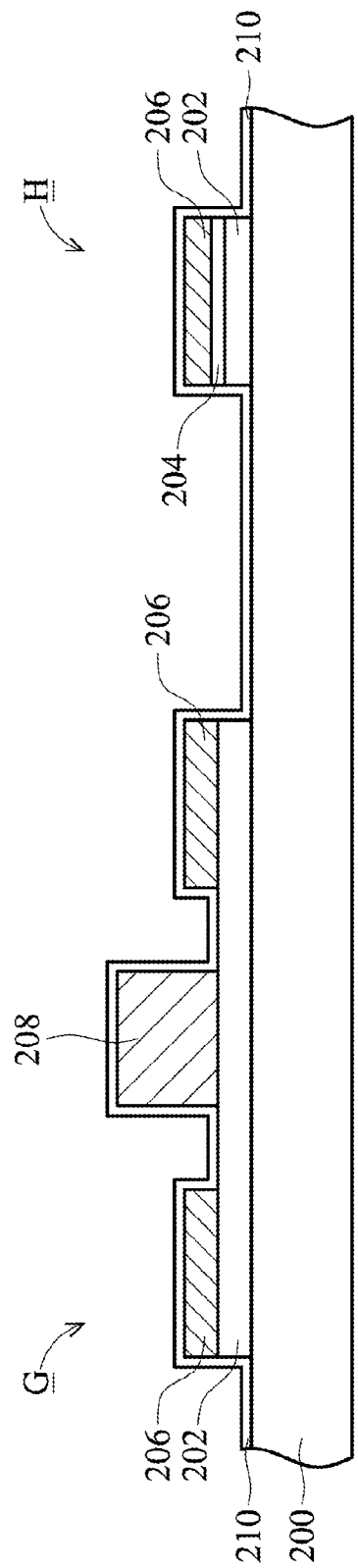

As shown in FIG. 9c, fabrication processes (not shown) similar with those used in conventional silicon semiconductor processes are next performed to define a source region, a drain region and a channel region (all not shown) in the channel layer 202. Next, an ohmic contact layer 206 is blanketly formed over the GaAs substrate 200 and a patterning process (not shown), such as conventional photolithography and etching processes, is performed to form a patterned ohmic contact layer 206 over the source region and the drain region of the channel layer 202 and over the capsule layer 204. In one embodiment, the ohmic contact layer 206 is a composite layer including an AuGe layer, a Ni layer and an Au layer stacked from bottom to top. Next, a conductive material 208 is blanketly formed over the GaAs substrate 200, and a patterning process (not shown), such as conventional photolithography and etching processes, is then performed to form a patterned gate electrode 208 over the channel region of the channel layer 202. In one embodiment, the gate electrode 208 may comprise conductive materials such as Ti, Au, and Pt.

As shown in FIG. 9c, an element G such as a transistor is thus formed over a portion of the GaAs substrate 200, and another device H is formed over another portion of the GaAs substrate 200. Next, a passivation layer 210 is formed over the GaAs substrate 200 to conformably cover exposed surfaces of the GaAs substrate 200, the element G, and the channel layer 202, the capsule layer 204, and the ohmic contact layer 206 in the element H, and the gate electrode 208. In one embodiment, the passivation layer 210 may comprise dielectric materials such as silicon nitride and have a thickness of about 100-2000 Å.

Figure 9D:
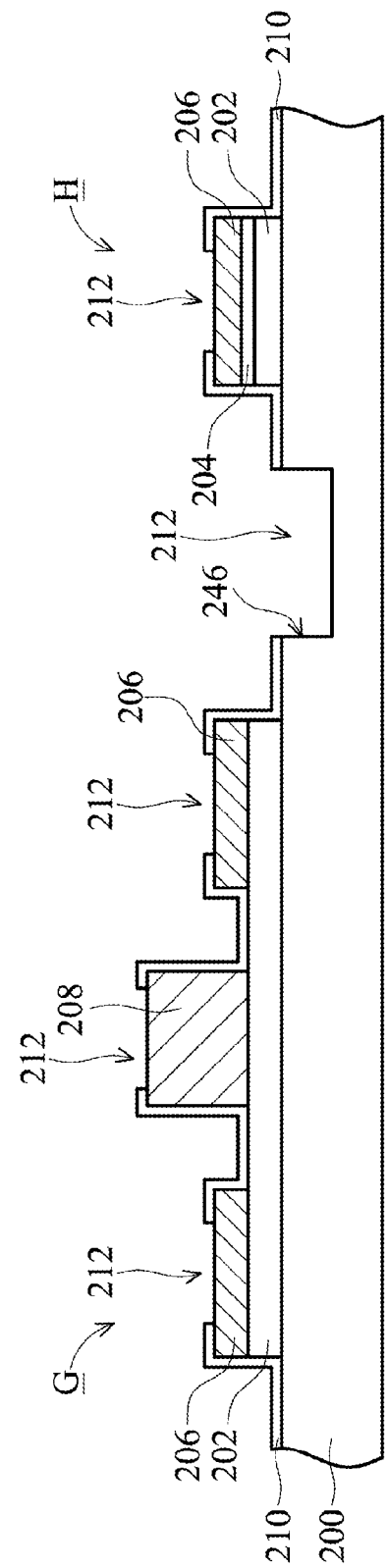

As shown in FIG. 9d, a portion of the passivation layer 210 over each of the elements G and H, the gate electrode 208, and a portion of the GaAs substrate 210 between the elements G and H is removed to form an opening 212 therein. In one embodiment, a patterning process (not shown), such as conventional photolithography and etching processes, is performed to simultaneously remove a portion of the passivation layer 210 over the elements G and H and the portion of the GaAs substrate 210 between the elements G and H, to respectively expose a portion of the elements G and H, and a portion of the GaAs substrate 200 between the device G and H. In another embodiment, a first patterning process (not shown) is first performed to remove a portion of the passivation layer 210 over the elements G and H to expose a portion of the elements G and H, and a second patterning process (not shown) is next performed to remove a portion of the protection layer 210 over the GaAs substrate 200 between the elements G and H to expose a portion of the GaAs substrate 200 between the elements G and H. Next, an etching process (not shown) is performed using the passivation layer 210, the ohmic contact layer 206 and the gate electrode 208 as etching masks to form a trench 246 in a portion of the GaAs substrate 200 exposed by the opening 212 between the elements G and H.

Figure 9E:
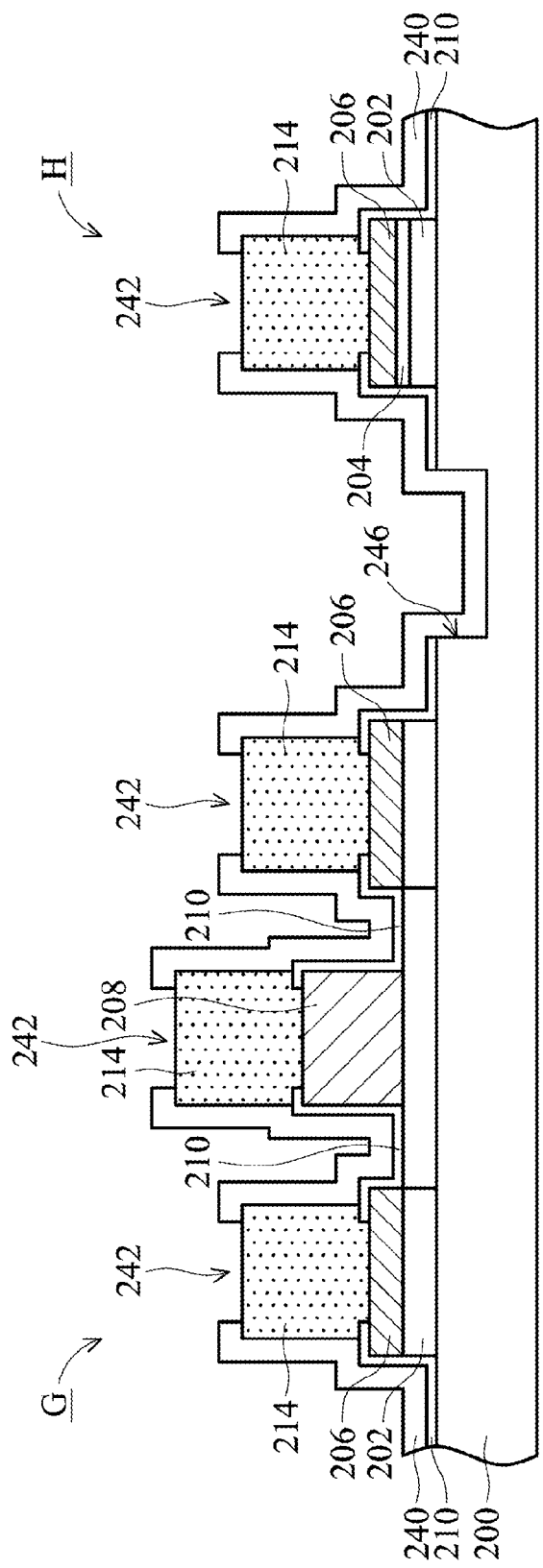
Figure 10:
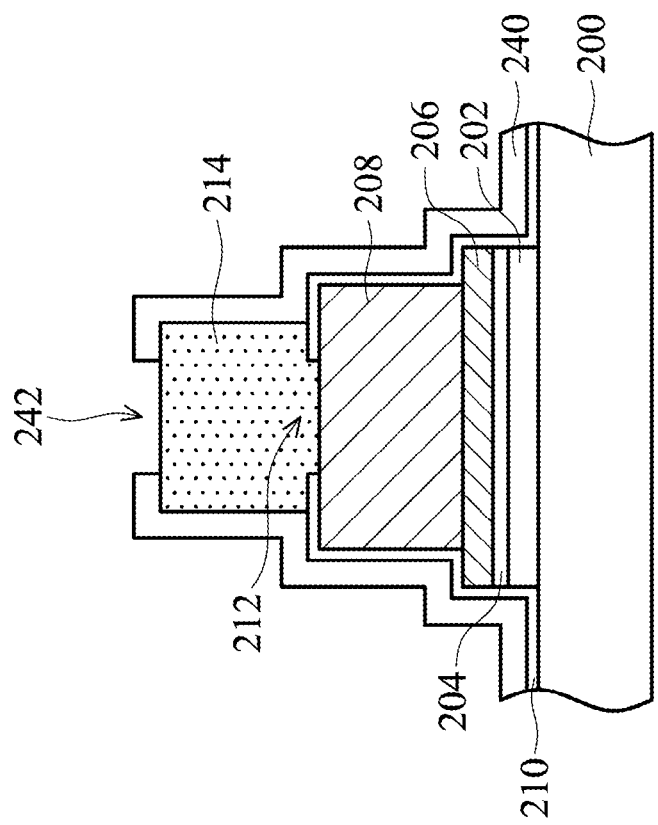
FIG. 10 is a schematic cross section of a capacitor according to an embodiment of the invention.

As shown in FIG. 9e, a conductive material is blanketly formed over the GaAs substrate 200 and a patterning process is then performed to the conductive material to form a contact electrode over the gate electrode 208 and the ohmic contact layer 206 of the elements G and H. Next, another passivation layer 240 is formed to conformably cover the passivation layer 210, the contact electrodes 214 and the GaAs substrate 200 exposed by the trench 246. Next, a patterning process (not shown) is performed to partially remove the passivation layer 240 over the elements G and H to expose a portion of the contact electrode 214.

As shown in FIG. 9e, a semiconductor device similar with the compound semiconductor device 250" shown in FIG. 8 is substantially fabricated, and the element G is illustrated as a transistor and the element H is illustrated as a conductive pad. The invention is not limited by the illustrations described as above and the element H can be replaced by a capacitor illustrated in FIG. 10. In addition, in other embodiments, the processes shown in FIGS. 9a-9e can be modified by neglecting the process for forming the trench 246 or replacing the process for forming the element G with the process for forming the element H, thereby forming the compound semiconductor devices 250 and 250' as shown in FIGS. 6-7.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a compound semiconductor device, comprising:
    providing a gallium arsenide (GaAs) substrate;
    forming a first element and a second element over a first portion and a second portion of the GaAs substrate, respectively;
    forming a first passivation layer over the GaAs substrate, the first element, and the second element;
    performing a patterning process, simultaneously removing a portion of the first passivation layer formed over the first element, the second element, and the GaAs substrate between the first and second elements and respectively exposing a portion of the first and second elements, and the portion of the GaAs substrate between the first and second elements;
    performing an etching process, using the first passivation layer as an etching mask, forming a trench in a portion of the GaAs substrate between the first and second elements;
    forming an electrode over the first and second elements; and
    forming a second passivation layer, conformably covering the first passivation layer, the electrode, and the GaAs substrate exposed by the trench.

2. The method as claimed in claim 1, wherein prior to formations of the first and second elements, the method further comprises forming a channel layer over the first and second portions of the GaAs substrate.

3. The method as claimed in claim 2, further comprising forming a capsule layer over the channel layer.

4. The method as claimed in claim 1, wherein the first and second elements comprise same or different elements including conductive structures.

5. The method as claimed in claim 1, wherein the first and second elements comprise transistors, capacitors, resistors or conductive pads.

6. The method as claimed in claim 1, wherein the first and second elements have a pitch of about 2-30 µm therebetween.

* * * * *